US012628295B2

(12) United States Patent
Huang et al.

(10) Patent No.: US 12,628,295 B2
(45) Date of Patent: May 12, 2026

(54) FOLDABLE ELECTRONIC DEVICE

(71) Applicant: SYNCMOLD ENTERPRISE CORP., New Taipei City (TW)

(72) Inventors: Chun-Hao Huang, New Taipei City (TW); Chien-Cheng Yeh, New Taipei City (TW)

(73) Assignee: SYNCMOLD ENTERPRISE CORP., New Taipei City (TW)

( * ) Notice: Subject to any disclaimer, the term of this patent is extended or adjusted under 35 U.S.C. 154(b) by 248 days.

(21) Appl. No.: 18/435,288

(22) Filed: Feb. 7, 2024

(65) Prior Publication Data

US 2025/0194028 A1 Jun. 12, 2025

Related U.S. Application Data

(60) Provisional application No. 63/500,303, filed on May 5, 2023.

(30) Foreign Application Priority Data

Dec. 11, 2023 (TW) .................................. 112213526

(51) Int. Cl.
*G06F 1/16* (2006.01)
*F16C 11/04* (2006.01)
*H05K 5/02* (2006.01)

(52) U.S. Cl.
CPC ............ *H05K 5/0226* (2013.01); *F16C 11/04* (2013.01); *H05K 5/0217* (2013.01)

(58) Field of Classification Search
None
See application file for complete search history.

(56) References Cited

U.S. PATENT DOCUMENTS

| | | | | |
|---|---|---|---|---|
| 12,130,671 | B2* | 10/2024 | Park | E05D 3/122 |
| 2021/0381289 | A1* | 12/2021 | Hsu | H04M 1/022 |
| 2023/0367363 | A1* | 11/2023 | Lee | G06F 1/1681 |

FOREIGN PATENT DOCUMENTS

| | | | |
|---|---|---|---|
| EP | 4199485 A1 | 6/2023 | |

* cited by examiner

*Primary Examiner* — Imani N Hayman
*Assistant Examiner* — Rashen E Morrison
(74) *Attorney, Agent, or Firm* — Studebaker Brackett PLLC

(57) ABSTRACT

A foldable electronic device is provided and includes a central base, a pivot module, a torque module, two panel bodies, two transmission members, two connecting rods and a flexible screen. The pivot module is disposed on the central base. The torque module is disposed on the pivot module. The panel bodies pivot relative to the central base. The transmission members pivot relative to the pivot module. The connecting rods pivot relative to the panel bodies and the transmission members. The flexible screen is disposed on the panel bodies and includes a bendable area. When the panel bodies are in an unfolded state, the flexible screen is flattened. When the panel bodies are in a folded state, the bendable area is bent.

13 Claims, 10 Drawing Sheets

FOLDABLE ELECTRONIC DEVICE

CROSS-REFERENCE TO RELATED APPLICATION

This application claims the benefit of U.S. Provisional Application Ser. No. 63/500,303 filed on May 5, 2023, and the benefit of Taiwan Patent Application Serial No. 112213526 filed on Dec. 11, 2023. The entirety of each application is incorporated herein by reference.

BACKGROUND

1. Technical Field

The present disclosure relates to a foldable electronic device, and more particularly, to a foldable electronic device having a flexible screen.

2. Description of Related Art

EP4199485 discloses an electronic equipment, and the electronic equipment comprises a first housing, a second housing and a hinge structure connected to the first housing and the second housing. The hinge structure includes a fixed structure, a first rotary structure, a second rotary structure, an arm structure and a torque structure. The arm structure has a first arm shaft, a second arm shaft, a first arm, a second arm, a gear structure, a fixed member and a stopper. The first rotary structure has a first sliding groove, and the second rotary structure has a second sliding groove. The first arm is connected to the first sliding groove via a first sliding pin, and the second arm is connected to the second sliding groove via a second sliding pin. When the first housing and the second housing rotate in opposite directions about rotation axes R1, R2 respectively, the first arm and the first sliding pin can slide relative to the first rotary structure from one end of the first sliding groove to the other end of the first sliding groove, and the second arm and the second sliding pin can slide relative to the second rotary structure from one end of the second sliding groove to the other end of the second sliding groove, such that the first housing and the second housing can relatively unfold or relatively fold to each other.

The electronic equipment disclosed in the aforementioned EP4199485 uses the structures of slideways and sliders to accomplish the unfolding or folding function. The present disclosure further provides a foldable electronic device that is different from the structures of slideways and sliders.

SUMMARY

The present disclosure provides a foldable electronic device, which comprises: a central base including a body portion, at least one first arc-shaped slider and at least one second arc-shaped slider, wherein the first arc-shaped slider and the second arc-shaped slider are respectively formed on the body portion and spaced apart from each other; a pivot module disposed on the central base and including a first rod and a second rod, wherein the first rod and the second rod are pivotally connected to the body portion along a first axis and a second axis respectively and are able to synchronously and reversely rotate; a torque module disposed on the pivot module; a first panel body including a first wing member, wherein the first wing member has at least one first arc-shaped slideway and a first pivot joint, the first arc-shaped slider is slidably disposed on the first arc-shaped slideway, whereby the first wing member is able to pivot relative to the body portion with a first virtual axis as a center; a first transmission member being sleeved on the first rod, wherein the first transmission member synchronously rotates with the first rod; a first connecting rod pivotally connected to the first transmission member along a first pivot axis and pivotally connected to the first pivot joint along a first rotating axis; a second panel body including a second wing member, wherein the second wing member has at least one second arc-shaped slideway and a second pivot joint, the second arc-shaped slider is slidably disposed on the second arc-shaped slideway, whereby the second wing member is able to pivot relative to the body portion with a second virtual axis as a center; a second transmission member being sleeved on the second rod, wherein the second transmission member synchronously rotates with the second rod and is spaced apart from the first transmission member; a second connecting rod pivotally connected to the second transmission member along a second pivot axis and pivotally connected to the second pivot joint along a second rotating axis; and a flexible screen disposed on the first panel body and the second panel body and comprising a bendable area; wherein the first panel body and the second panel body are able to transform between an unfolded state and a folded state, wherein when the first panel body and the second panel body are in the unfolded state, the flexible screen is flattened, and the first wing member and the second wing member jointly support the bendable area, wherein when the first panel body and the second panel body are in the folded state, the bendable area of the flexible screen bends, and the first wing member, the second wing member and the central base jointly define an accommodating space for accommodating the bendable area.

In the aforementioned foldable electronic device, a first external angle is formed between the first connecting rod and the first wing member, and a second external angle is formed between the second connecting rod and the second wing member, wherein when the first panel body and the second panel body are in the unfolded state, the first external angle and the second external angle are minimum, wherein when the first panel body and the second panel body are transformed from the unfolded state to the folded state, the first external angle and the second external angle gradually become greater, wherein when the first panel body and the second panel body are in the folded state, the first external angle and the second external angle are maximum.

In the aforementioned foldable electronic device, wherein when the first panel body and the second panel body are in the unfolded state, a distance between the first rotating axis and the first axis is less than a distance between the first pivot axis and the first axis, and a distance between the second rotating axis and the second axis is less than a distance between the second pivot axis and the second axis, wherein when the first panel body and the second panel body are in the folded state, the distance between the first rotating axis and the first axis is greater than the distance between the first pivot axis and the first axis, and the distance between the second rotating axis and the second axis is greater than the distance between the second pivot axis and the second axis.

In the aforementioned foldable electronic device, the first transmission member includes a first fixed joint, a first bending plate and a first shaft joint that are integrally formed, wherein the first fixed joint is fixed to the first rod along the first axis, the first bending plate bends and extends outwardly from the first fixed joint along a radial direction of the first axis, and the first shaft joint extends outwardly from the first bending plate and is pivotally connected to the first connecting rod along the first pivot axis; wherein the second transmission member includes a second fixed joint, a second bending plate and a second shaft joint that are integrally formed, wherein the second fixed joint is fixed to the second rod along the second axis, the second bending plate bends and extends outwardly from the second fixed joint along a radial direction of the second axis, and the second shaft joint extends outwardly from the second bending plate and is pivotally connected to the second connecting rod along the second pivot axis.

In the aforementioned foldable electronic device, the torque module includes a plurality of friction fixed pieces and two pivot fixed pieces that are being passed through by the first rod and the second rod, wherein one of the friction fixed pieces is disposed on one side of the first transmission member and one side of the second transmission member, the others of the friction fixed pieces are disposed between the pivot fixed pieces, and one of the pivot fixed pieces abuts against the first fixed joint and the second fixed joint.

In the aforementioned foldable electronic device, the pivot module further includes a first tooth portion, a second tooth portion and two gears, wherein the first tooth portion is formed on one end of the first rod, the second tooth portion is formed on one end of the second rod, and the gears are meshed with each other and disposed between the first tooth portion and the second tooth portion and are meshed with the first tooth portion and the second tooth portion respectively, such that the first rod and the second rod are able to synchronously and reversely rotate.

In the aforementioned foldable electronic device, wherein when the first panel body and the second panel body are in the unfolded state, both the first external angle and the second external angle are less than 45 degrees, wherein when the first panel body and the second panel body are in the folded state, both the first external angle and the second external angle are greater than 135 degrees.

In the aforementioned foldable electronic device, each of the friction fixed pieces has a first penetrating hole and a second penetrating hole, and each of the pivot fixed pieces has a first shaft hole and a second shaft hole, wherein the first rod passes through the first penetrating hole and the first shaft hole, and the second rod passes through the second penetrating hole and the second shaft hole.

In the aforementioned foldable electronic device, the torque module further includes a plurality of first stop washers, a plurality of first bowl-shaped washers, a plurality of second stop washers and a plurality of second bowl-shaped washers, wherein the first stop washers are sleeved on the first rod and located between the pivot fixed pieces, and move synchronously with the first rod, wherein the first bowl-shaped washers are sleeved on the first rod and constantly provide a first elastic force, and the first elastic force tends to make the first stop washers abut against the pivot fixed pieces and the friction fixed pieces, wherein the second stop washers are sleeved on the second rod and located between the pivot fixed pieces, and move synchronously with the second rod, wherein the second bowl-shaped washers are sleeved on the second rod and constantly provide a second elastic force, and the second elastic force tends to make the second stop washers abut against the pivot fixed pieces and the friction fixed pieces.

In the aforementioned foldable electronic device, the pivot module further includes a first nut and a second nut, wherein the first nut is screwed to the other end of the first rod, and the second nut is screwed to the other end of the second rod, wherein the first bowl-shaped washers are located between the first nut and the pivot fixed pieces, and the second bowl-shaped washers are located between the second nut and the pivot fixed pieces.

In the aforementioned foldable electronic device, wherein when the first panel body and the second panel body are in the unfolded state, the first panel body and the second panel body are substantially 180 degrees apart, wherein when the first panel body and the second panel body are in the folded state, the first panel body and the second panel body are substantially 0 degrees apart, wherein when the first panel body and the second panel body are transformed between the unfolded state and the folded state, the first rod and the second rod synchronously and reversely rotate, so that the first stop washers, the second stop washers, the first fixed joint and the second fixed joint simultaneously generate friction with the pivot fixed pieces and the friction fixed pieces, such that the first panel body and the second panel body are able to stop at any position and sandwich an angle between 0 degrees and 180 degrees.

In the aforementioned foldable electronic device, the first panel body further includes a first limiting member and a first accommodating groove, the first limiting member extends outwardly from the first wing member, and the first accommodating groove is surrounded and defined by the first wing member and the first limiting member, wherein the second panel body further includes a second limiting member and a second accommodating groove, the second limiting member extends outwardly from the second wing member and is spaced apart from the first limiting member, and the second accommodating groove is surrounded and defined by the second wing member and the second limiting member.

In the aforementioned foldable electronic device, wherein when the first panel body and the second panel body are in the unfolded state, the pivot module, the torque module, the first transmission member and the second transmission member are respectively and partially accommodated in the first accommodating groove and the second accommodating groove, and the first transmission member and the second transmission member are separated from the first limiting member and the second limiting member respectively, wherein when the first panel body and the second panel body are in the folded state, the pivot module, the torque module, the first transmission member and the second transmission member are separated from the first accommodating groove and the second accommodating groove respectively, and the first transmission member and the second transmission member abut against the first limiting member and the second limiting member respectively.

In the aforementioned foldable electronic device, the first axis, the first virtual axis, the first pivot axis, the first rotating axis, the second axis, the second virtual axis, the second pivot axis and the second rotating axis are parallel to each other.

DETAILED DESCRIPTION

Figure 1:
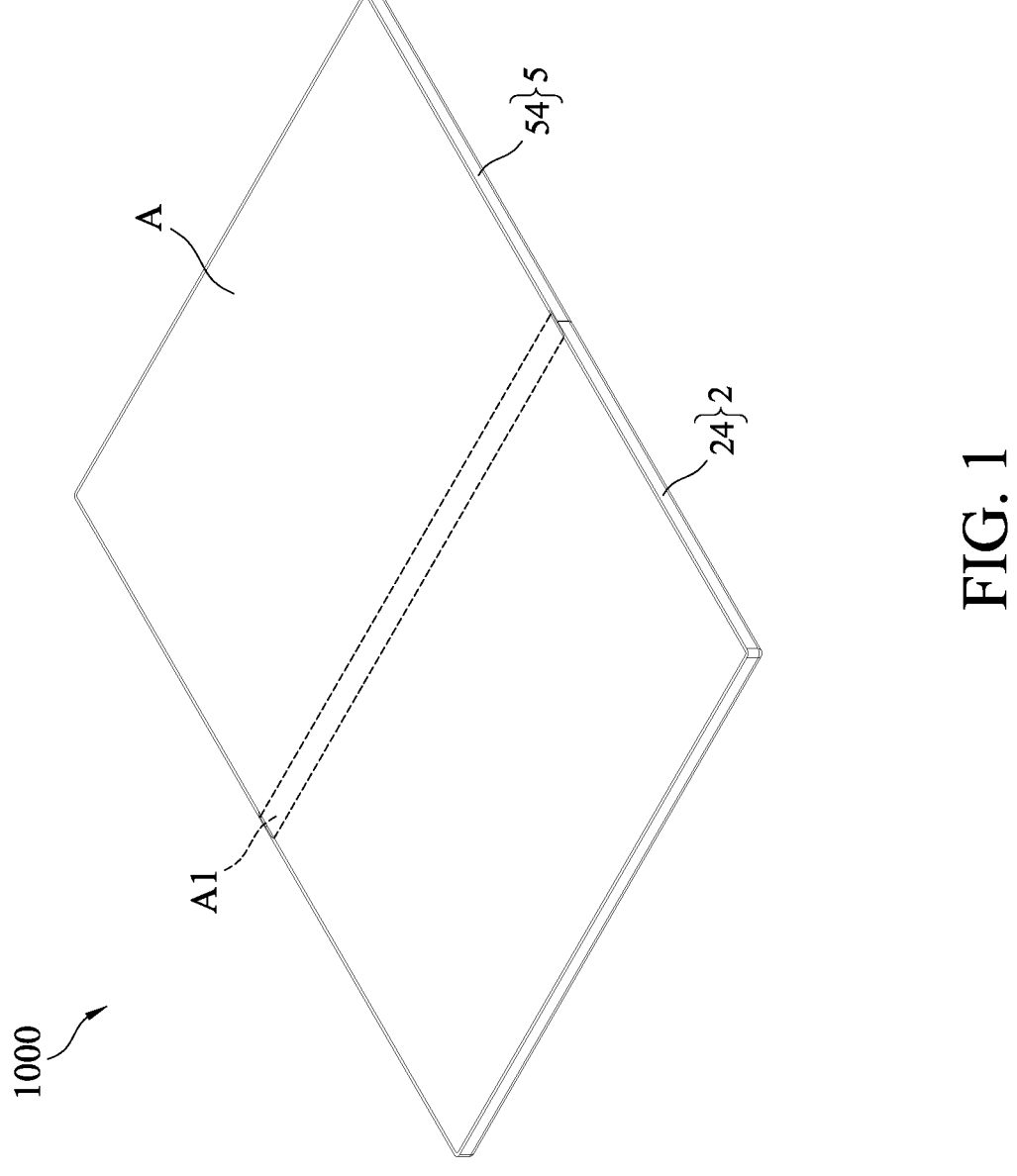
FIG. 1 is a schematic view of a foldable electronic device according to the present disclosure in an unfolded state.
Figure 2:
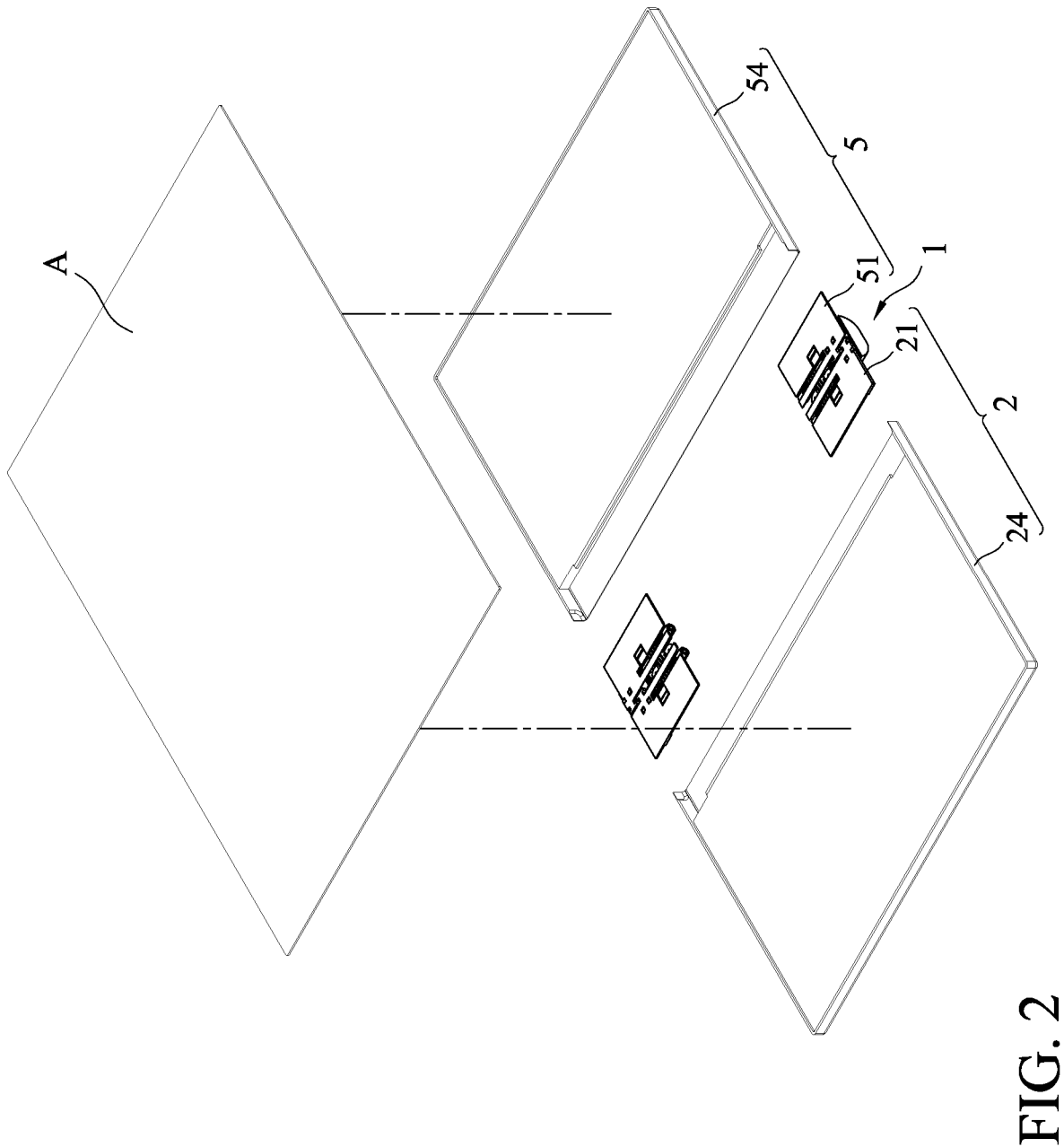
FIG. 2 is a schematic exploded view of the foldable electronic device according to the present disclosure in an unfolded state.
Figure 3:
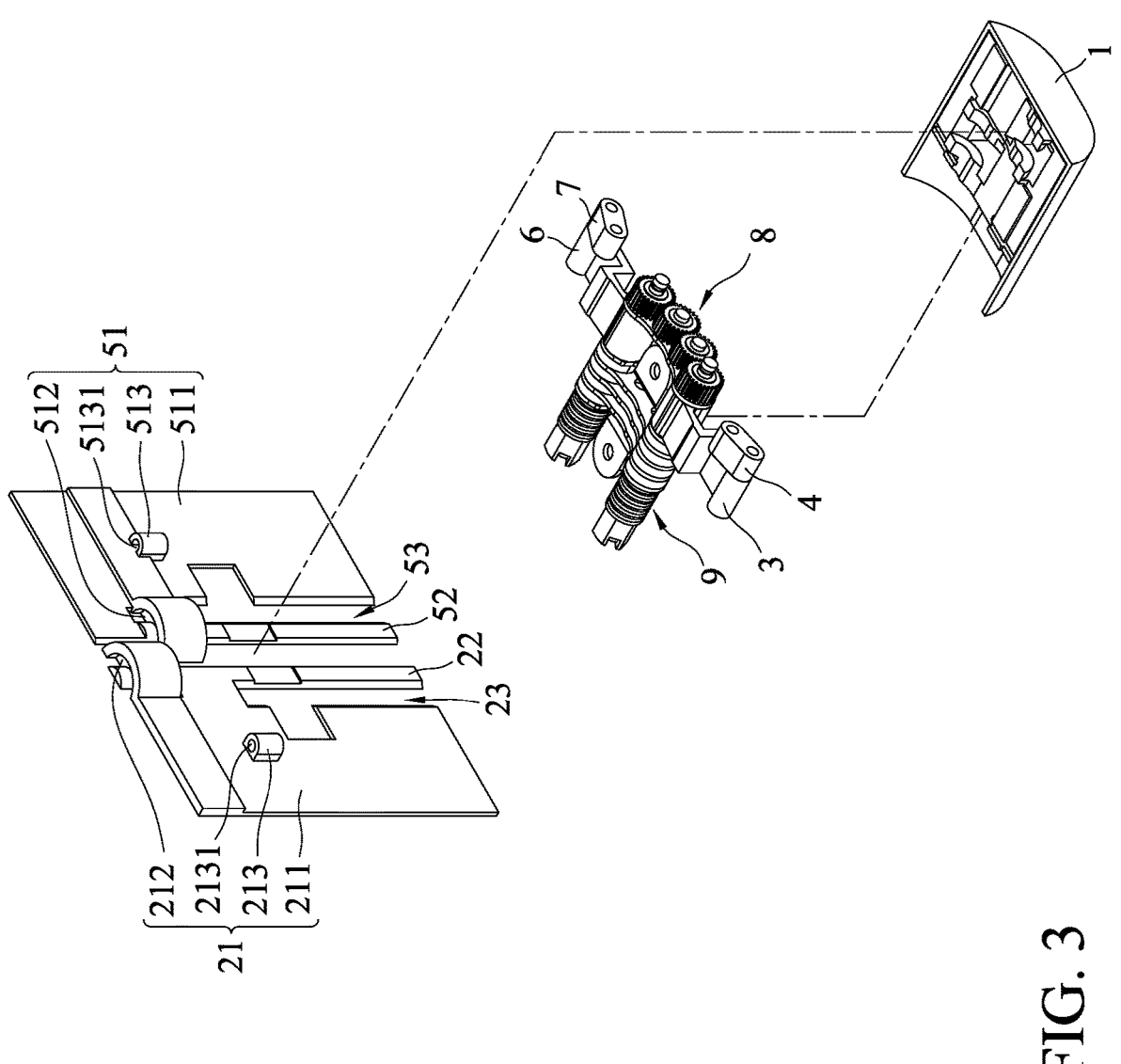
FIG. 3 is a schematic exploded view of some elements of the foldable electronic device according to the present disclosure.

Please refer to FIG. 1, FIG. 2 and FIG. 3, a foldable electronic device 1000 of the present disclosure comprises a central base 1, a first panel body 2, a first transmission member 3, a first connecting rod 4, a second panel body 5, a second transmission member 6, a second connecting rod 7, a pivot module 8, a torque module 9 and a flexible screen A, wherein the first panel body 2 and the second panel body 5 are pivotally connected on two sides of the central base 1 respectively, the pivot module 8 is disposed on the central base 1, the first transmission member 3 and the second transmission member 6 are connected to two sides of the pivot module 8 respectively, the first connecting rod 4 is connected to the first panel body 2 and the first transmission member 3, the second connecting rod 7 is connected to the second panel body 5 and the second transmission member 6, the torque module 9 is disposed on the pivot module 8, and the flexible screen A is disposed on the first panel body 2 and the second panel body 5. The structure of each element and the connection relationship between each other will be described in detail below, wherein parts of the drawings are drawn with a first axis X1, a first virtual axis VX1, a first pivot axis PX1, a first rotating axis SX1, a second axis X2, a second virtual axis VX2, a second pivot axis PX2 and a second rotating axis SX2 that are parallel to each other and do not overlap. It should be noted that some elements of the foldable electronic device 1000 of the present disclosure may be a group or a plurality of groups. However, whether it is one group or multiple groups, the action effect of the present disclosure can be achieved. The following is a simplified description, and only one group is used as an example.

Figure 4:
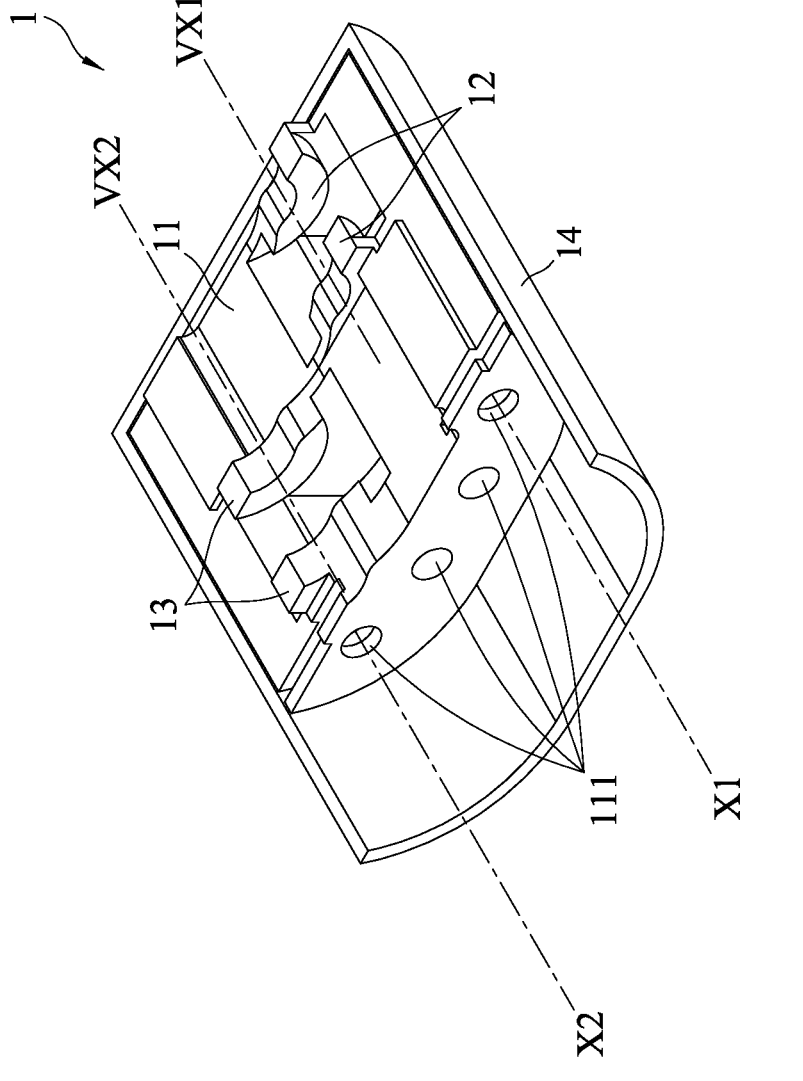
FIG. 4 is a schematic view of different viewing angles of a central base of the foldable electronic device according to the present disclosure.
Figure 6:
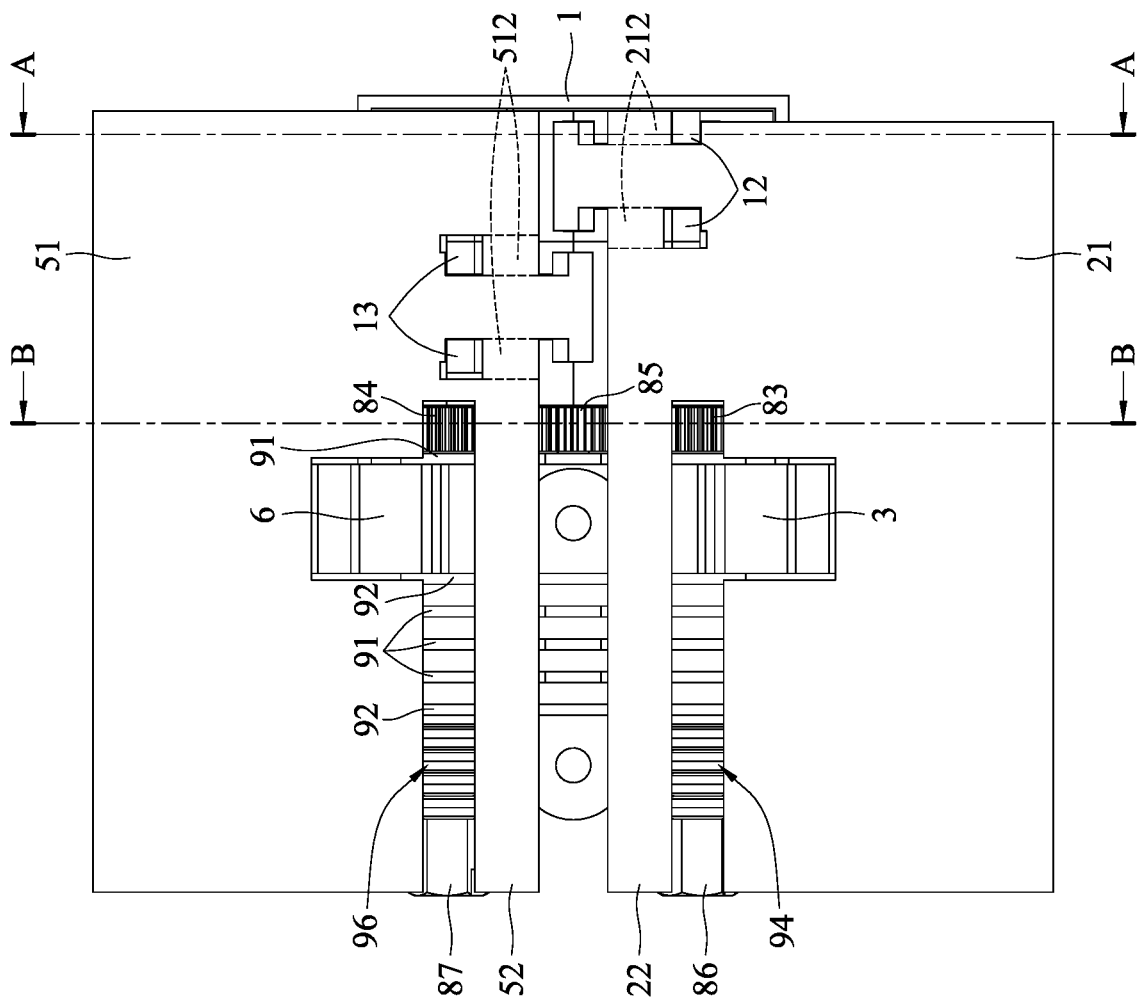
FIG. 6 is a schematic top view of the foldable electronic device according to the present disclosure in an unfolded state.
Figure 7:
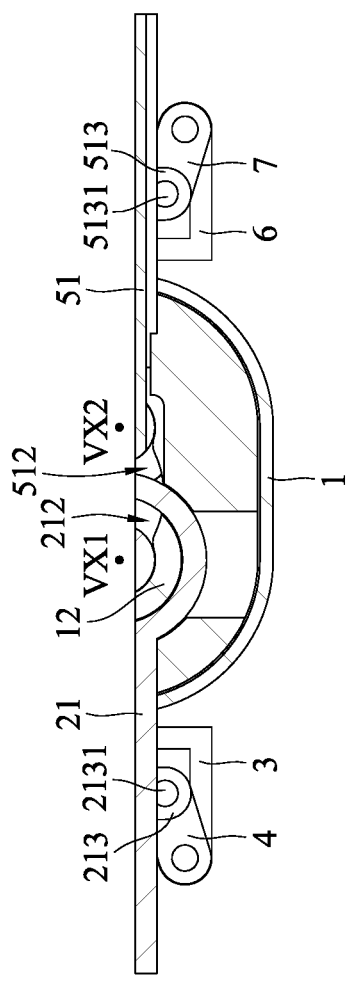
FIG. 7 is a schematic cross-sectional view of the foldable electronic device according to the present disclosure along the section line A-A of FIG. 6.

Please refer to FIG. 4, FIG. 6 and FIG. 7 at the same time, the central base 1 includes a body portion 11, two first arc-shaped sliders 12, two second arc-shaped sliders 13 and a shell 14. The body portion 11 has four axis holes 111 spaced apart from each other, wherein two of the axis holes 111 are formed along the first axis X1 and the second axis X2, wherein the other two of the axis holes 111 are formed parallel to the first axis X1 or the second axis X2. The first arc-shaped sliders 12 are roughly semi-arc-shaped, protruding from the body portion 11 at an interval and opposite to each other, and adjacent to two adjacent sides of the body portion 11 (i.e., adjacent to the front end of the first panel body 2 and the body portion 11), and its axis can be defined as the first virtual axis VX1. The second arc-shaped sliders 13 are roughly semi-arc-shaped, protruding from the body portion 11 at an interval and opposite to each other, and adjacent to another two adjacent sides of the body portion 11 (i.e., adjacent to the rear end of the second panel body 5 and the body portion 11), and are spaced apart from and diagonally corresponding to the first arc-shaped sliders 12, and its axis can be defined as the second virtual axis VX2. The shell 14 covers the bottom side and the front side of the body portion 11.

The first panel body 2 includes a first wing member 21, a first limiting member 22, a first accommodating groove 23 and a first panel shell 24. The first wing member 21 has a first wing body 211, two first arc-shaped slideways 212 and a first pivot joint 213. The first wing body 211 is roughly an L-shaped plate body. The first arc-shaped slideways 212 are recessed and formed on a side of the first wing body 211 adjacent to the body portion 11 and spaced apart, and are respectively provided for sliding by the first arc-shaped sliders 12, whereby the first wing member 21 can pivot relative to the body portion 11 with the first virtual axis VX1 as the center. The first pivot joint 213 extends outwardly from the first wing body 211 and has a first pivot joint hole 2131 formed therethrough along the first rotating axis SX1. The first limiting member 22 is roughly in the shape of a long strip extending outwardly from the first wing body 211. The first accommodating groove 23 is surrounded and defined by the first wing body 211 and the first limiting member 22 and is roughly in the shape of a key. The first panel shell 24 is roughly in a quadrilateral shape and fixed to the first wing member 21. In addition, the first panel body 2 further includes electronic components, but details of the electronic components will not be described here since the electronic components are relatively irrelevant to the folding operation.

Figure 5:
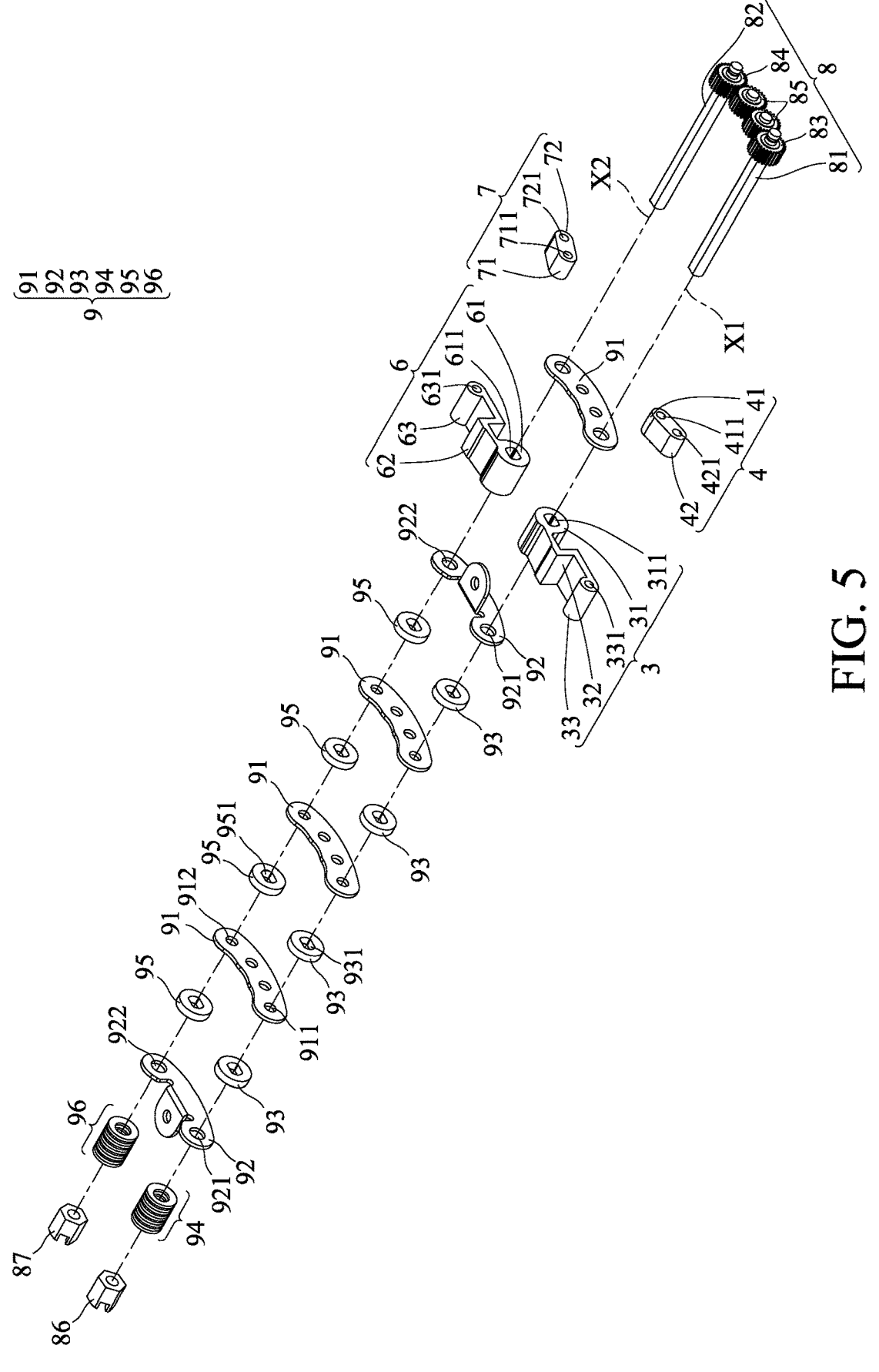
FIG. 5 is a schematic exploded view of some elements of the foldable electronic device according to the present disclosure.
Figure 8:
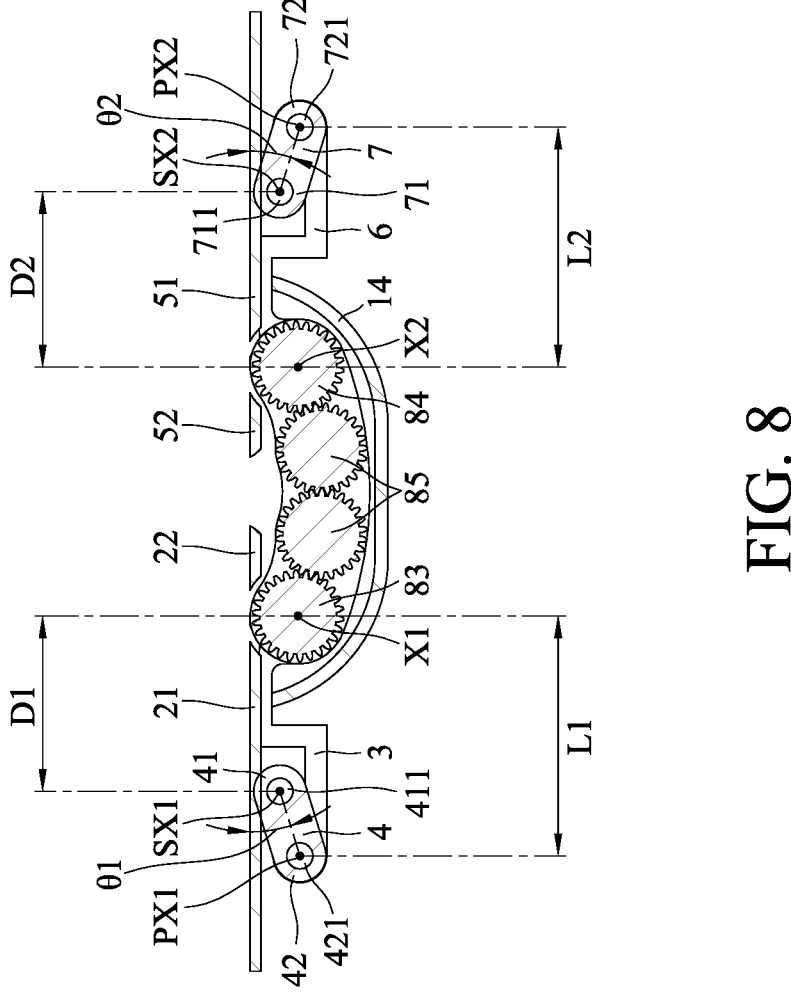
FIG. 8 is a schematic cross-sectional view of the foldable electronic device according to the present disclosure along the section line B-B of FIG. 6.

Please refer to FIG. 5, the first transmission member 3 includes a first fixed joint 31, a first bending plate 32 and a first shaft joint 33 that are integrally formed. The first fixed joint 31 has a first fixed joint hole 311 formed therethrough along the first axis X1, and the cross-section of the first fixed joint hole 311 is non-circular. The first bending plate 32 bends and extends outwardly from the first fixed joint 31 along the radial direction of the first axis X1. The first shaft joint 33 extends outwardly from the first bending plate 32 and has a first shaft joint hole 331 formed therethrough along the first pivot axis PX1 (as shown in FIG. 8).

The first connecting rod 4 includes a first rotating shaft portion 41 and a first pivot shaft portion 42 spaced apart from each other. The first rotating shaft portion 41 has a first rotating shaft hole 411 formed therethrough along the first rotating axis SX1. The first rotating shaft portion 41 and the first pivot joint 213 are pivotally connected to each other via a pin that is simultaneously penetrated through the first rotating shaft hole 411 and the first pivot joint hole 2131, such that the first connecting rod 4 is able to pivot relative to the first wing member 21 with the first rotating axis SX1 as the center, and a first external angle θ1 is formed between the first connecting rod 4 and the first wing member 21. The first pivot shaft portion 42 has a first pivot shaft hole 421 formed therethrough along the first pivot axis PX1. The first pivot shaft portion 42 and the first shaft joint 33 are pivotally connected to each other via a pin that is simultaneously penetrated through the first pivot shaft hole 421 and the first shaft joint hole 331, such that the first connecting rod 4 is able to pivot relative to the first transmission member 3 with the first pivot axis PX1 as the center.

The second panel body 5 is disposed opposite to the first panel body 2, and the second panel body 5 includes a second wing member 51, a second limiting member 52, a second accommodating groove 53 and a second panel shell 54. The second wing member 51 has a second wing body 511, two second arc-shaped slideways 512 and a second pivot joint 513. The second wing body 511 is roughly an L-shaped plate body. The second arc-shaped slideways 512 are recessed and formed on a side of the second wing body 511 adjacent to the body portion 11 and spaced apart, and are respectively provided for sliding by the second arc-shaped sliders 13, whereby the second wing member 51 can pivot relative to the body portion 11 with the second virtual axis VX2 as the center. The second pivot joint 513 extends outwardly from the second wing body 511 and has a second pivot joint hole 5131 formed therethrough along the second rotating axis SX2. The second limiting member 52 is roughly in the shape of a long strip extending outwardly from the second wing body 511. The second accommodating groove 53 is surrounded and defined by the second wing body 511 and the second limiting member 52 and is roughly in the shape of a key. The second panel shell 54 is roughly in a quadrilateral shape and fixed to the second wing member 51. In addition, the second panel body 5 further includes electronic components, which are the same as above and will not be described here.

The second transmission member 6 is spaced apart from the first transmission member 3, and the second transmission member 6 includes a second fixed joint 61, a second bending plate 62 and a second shaft joint 63 that are integrally formed. The second fixed joint 61 has a second fixed joint hole 611 formed therethrough along the second axis X2, and the cross-section of the second fixed joint hole 611 is non-circular. The second bending plate 62 bends and extends outwardly from the second fixed joint 61 along the radial direction of the second axis X2. The second shaft joint 63 extends outwardly from the second bending plate 62 and has a second shaft joint hole 631 formed therethrough along the second pivot axis PX2.

The second connecting rod 7 includes a second rotating shaft portion 71 and a second pivot shaft portion 72 spaced apart from each other. The second rotating shaft portion 71 has a second rotating shaft hole 711 formed therethrough along the second rotating axis SX2. The second rotating shaft portion 71 and the second pivot joint 513 are pivotally connected to each other via a pin that is simultaneously penetrated through the second rotating shaft hole 711 and the second pivot joint hole 5131, such that the second connecting rod 7 is able to pivot relative to the second wing member 51 with the second rotating axis SX2 as the center, and a second external angle θ2 is formed between the second connecting rod 7 and the second wing member 51. The second pivot shaft portion 72 has a second pivot shaft hole 721 formed therethrough along the second pivot axis PX2. The second pivot shaft portion 72 and the second shaft joint 63 are pivotally connected to each other via a pin that is simultaneously penetrated through the second pivot shaft hole 721 and the second shaft joint hole 631, such that the second connecting rod 7 is able to pivot relative to the second transmission member 6 with the second pivot axis PX2 as the center.

The pivot module 8 includes a first rod 81, a second rod 82, a first tooth portion 83, a second tooth portion 84, two gears 85, a first nut 86 and a second nut 87. The first rod 81 is pivotally connected to the outermost axis hole 111 along the first axis X1 and passes through the first fixed joint hole 311, and the cross-section of the first rod 81 matches the cross-section of the first fixed joint hole 311 as non-circular, whereby the first fixed joint 31 can rotate synchronously with the first rod 81. The second rod 82 is pivotally connected to another outermost axis hole 111 along the second axis X2 and passes through the second fixed joint hole 611, and the cross-section of the second rod 82 matches the cross-section of the second fixed joint hole 611 as non-circular, whereby the second fixed joint 61 can rotate synchronously with the second rod 82. The first tooth portion 83 and the second tooth portion 84 are both roughly gear-shaped, and are formed on one end of the first rod 81 adjacent to the body portion 11 and on one end of the second rod 82 adjacent to the body portion 11 respectively. The gears 85 are pivotally connected to two axis holes 111 respectively in the middle of the body portion 11 and are disposed between the first tooth portion 83 and the second tooth portion 84, and the gears 85 are meshed with each other and are meshed with the first tooth portion 83 and the second tooth portion 84 respectively, whereby the first rod 81 can synchronously and reversely rotate with the second rod 82. The first nut 86 is screwed into one end of the first rod 81 away from the body portion 11, and the second nut 87 is screwed into one end of the second rod 82 away from the body portion 11.

The torque module 9 includes four friction fixed pieces 91, two pivot fixed pieces 92, four first stop washers 93, a plurality of first bowl-shaped washers 94, four second stop washers 95 and a plurality of second bowl-shaped washers 96. Each of the friction fixed pieces 91 is roughly an arc-shaped piece, and has a first penetrating hole 911 for the first rod 81 to penetrate and a second penetrating hole 912 for the second rod 82 to penetrate. One of the friction fixed pieces 91 is disposed between the first tooth portion 83 and the first fixed joint 31 and between the second tooth portion 84 and the second fixed joint 61, and abuts against one side of the first fixed joint 31 and the second fixed joint 61. The other three of the friction fixed pieces 91 are disposed between the pivot fixed pieces 92. Each of the pivot fixed pieces 92 is roughly an arc-shaped piece, and has a first shaft hole 921 for the first rod 81 to penetrate and a second shaft hole 922 for the second rod 82 to penetrate. One of the pivot fixed pieces 92 abuts against another side of the first fixed joint 31 and the second fixed joint 61.

The first stop washers 93 are sleeved on the first rod 81 and respectively located between the pivot fixed pieces 92, and are alternatively stacked with the friction fixed pieces 91. Each of the first stop washers 93 has a first through hole 931 penetrating therethrough along the first axis X1 for the first rod 81 to pass through, and the cross-section of the first through hole 931 matches the cross-section of the first rod 81 as non-circular, whereby the first stop washers 93 can move synchronously with the first rod 81. The first bowl-shaped washers 94 are sleeved on the first rod 81 and located between the first nut 86 and the pivot fixed pieces 92, and the first bowl-shaped washers 94 constantly provide a first elastic force and tend to make the first stop washers 93 abut against the pivot fixed pieces 92 and the friction fixed pieces 91, and adjusting the distance between the first nut 86 and the pivot fixed pieces 92 can change the magnitude of the first elastic force.

The second stop washers 95 are sleeved on the second rod 82 and respectively located between the pivot fixed pieces 92, and are alternatively stacked with the friction fixed pieces 91. Each of the second stop washers 95 has a second through hole 951 penetrating therethrough along the second axis X2 for the second rod 82 to pass through, and the cross-section of the second through hole 951 matches the cross-section of the second rod 82 as non-circular, whereby the second stop washers 95 can move synchronously with the second rod 82. The second bowl-shaped washers 96 are sleeved on the second rod 82 and located between the second nut 87 and the pivot fixed pieces 92, and the second bowl-shaped washers 96 constantly provide a second elastic force and tend to make the second stop washers 95 abut against the pivot fixed pieces 92 and the friction fixed pieces 91, and adjusting the distance between the second nut 87 and the pivot fixed pieces 92 can change the magnitude of the second elastic force.

The flexible screen A is disposed on the first panel body 2 and the second panel body 5, and the flexible screen A includes a bendable area A1, wherein the bendable area A1 roughly corresponds to the central base 1.

Figure 9:
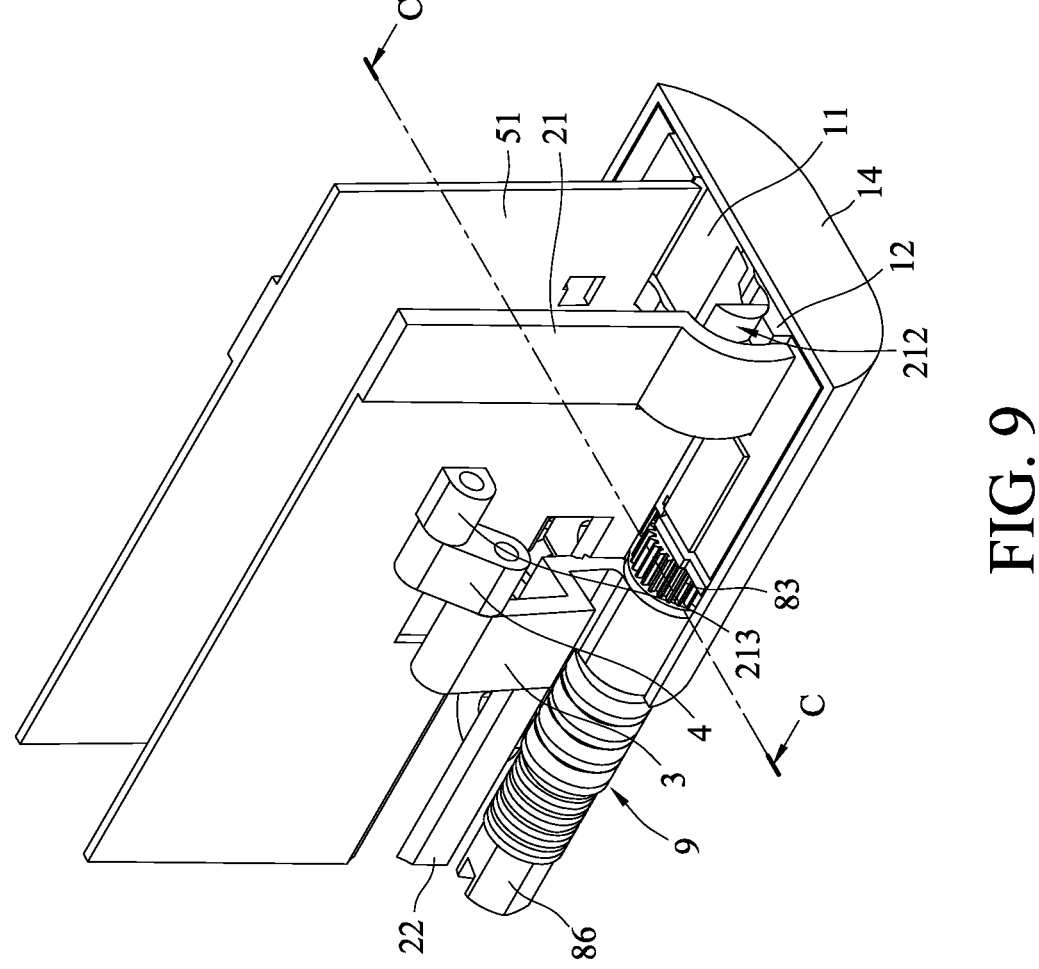
FIG. 9 is a schematic view of the foldable electronic device according to the present disclosure in a folded state.
Figure 10:
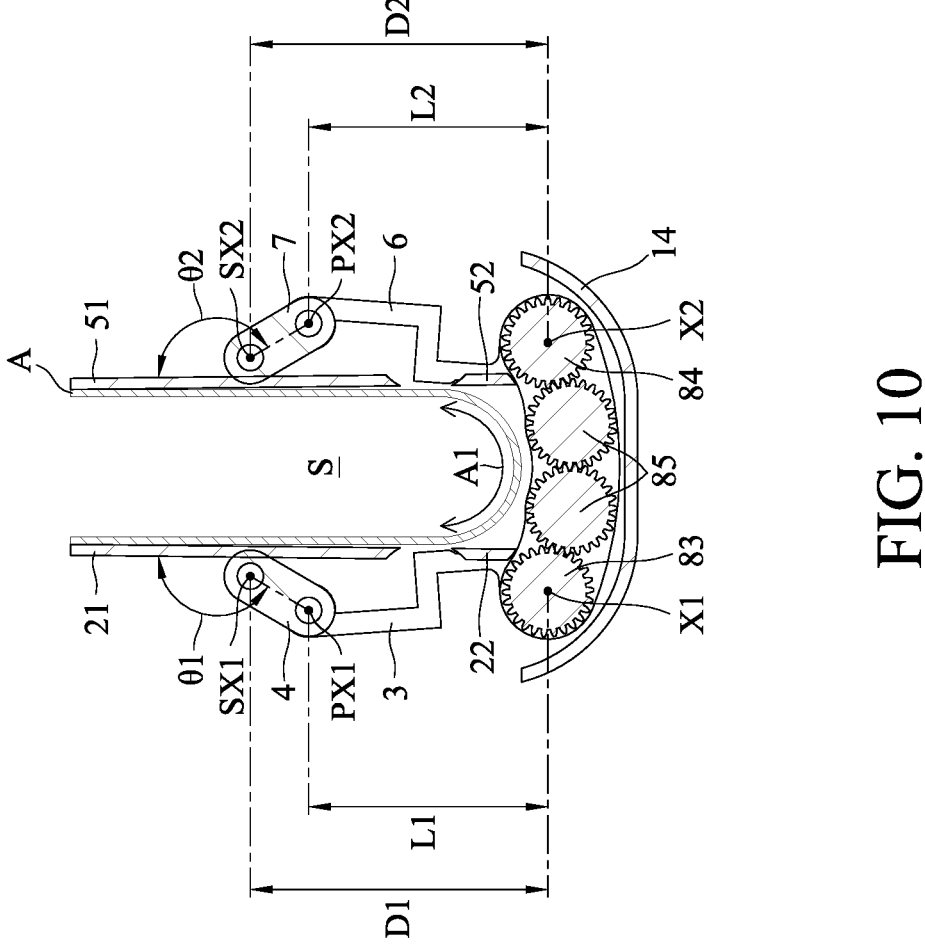
FIG. 10 is a schematic cross-sectional view of the foldable electronic device according to the present disclosure along the section line C-C of FIG. 9.

The following describes the operation of the foldable electronic device 1000 of the present disclosure. The first panel body 2 and the second panel body 5 can be transformed between the unfolded state (as shown in FIG. 6 to FIG. 8) and the folded state (as shown in FIG. 9 and FIG. 10). When the first panel body 2 and the second panel body 5 are in the unfolded state, the first panel body 2 and the second panel body 5 are substantially 180 degrees apart, the flexible screen A is flattened, the first wing member 21 and the second wing member 51 jointly support the bendable area A1, and the first external angle θ1 and the second external angle θ2 are minimum, roughly less than 45 degrees. A distance D1 between the first rotating axis SX1 and the first axis X1 is less than a distance L1 between the first pivot axis PX1 and the first axis X1, and a distance D2 between the second rotating axis SX2 and the second axis X2 is less than a distance L2 between the second pivot axis PX2 and the second axis X2. That is, the first rotating axis SX1 is substantially between the first axis X1 and the first pivot axis PX1, and the second rotating axis SX2 is substantially between the second axis X2 and the second pivot axis PX2. The pivot module 8, the torque module 9, the first transmission member 3 and the second transmission member 6 are respectively and partially accommodated in the first accommodating groove 23 and the second accommodating groove 53, and the first transmission member 3 and the second transmission member 6 are separated from the first limiting member 22 and the second limiting member 52 respectively.

When the first panel body 2 and the second panel body 5 are transformed from the unfolded state (FIG. 7 and FIG. 8) to the folded state (FIG. 10), the first wing member 21 and the second wing member 51 pivot relative to the body portion 11 with the first virtual axis VX1 and the second virtual axis VX2 as the center respectively, and the first wing member 21 and the second wing member 51 at the same time pivot relative to the first connecting rod 4 and the second connecting rod 7 with the first rotating axis SX1 and the second rotating axis SX2 as the center respectively. The first connecting rod 4 and the second connecting rod 7 also at the same time pivot relative to the first transmission member 3 and the second transmission member 6 with the first pivot axis PX1 and the second pivot axis PX2 as the center respectively, the first transmission member 3 and the second transmission member 6 synchronously rotate with the first rod 81 and the second rod 82 respectively, and the first rod 81 and the second rod 82 synchronously and reversely rotate via the first tooth portion 83, the second tooth portion 84 and the gears 85. At this time, the first external angle θ1 and the second external angle θ2 gradually become greater, the pivot module 8, the torque module 9, the first transmission member 3 and the second transmission member 6 gradually separate from the first accommodating groove 23 and the second accommodating groove 53 respectively, and gradually approach the first limiting member 22 and the second limiting member 52, making the distance D1 between the first rotating axis SX1 and the first axis X1 gradually become greater (the distance L1 between the first pivot axis PX1 and the first axis X1 gradually become lesser), and the distance D2 between the second rotating axis SX2 and the second axis X2 gradually become greater (the distance L2 between the second pivot axis PX2 and the second axis X2 gradually become lesser). The first stop washers 93, the second stop washers 95, the first fixed joint 31 and the second fixed joint 61 simultaneously generate friction with the pivot fixed pieces 92 and the friction fixed pieces 91, whereby the first panel body 2 and the second panel body 5 are able to stop at any position and sandwich an angle between 0 degrees and 180 degrees.

Furthermore, the transformation of the first panel body 2 and the second panel body 5 from the unfolded state to the folded state is synchronous, and even when only the first panel body 2 is moved and pivoted, the first connecting rod 4 will drive the first transmission member 3 to pivot with the first pivot axis PX1 as the center, together the first transmission member 3 will drive the first rod 81 to pivot with the first axis X1 as the center. Thus during the rotation of the first rod 81, the first tooth portion 83, the second tooth portion 84 and the gears 85 meshed and moved with each other will drive the second rod 82 to pivot with the second axis X2 as the center (pivot the opposite direction to the first rod 81), making the second transmission member 6 and the second connecting rod 7 to pivot relatively, thereby generating the above related movements, such that the second panel body 5 is able to pivot synchronously. Similarly, if only the second panel body 5 is moved, the first panel body 2 will also pivot synchronously, and relevant details will not be described again.

As shown in FIG. 9 and FIG. 10, when the first panel body 2 and the second panel body 5 are in the folded state, the first panel body 2 and the second panel body 5 are substantially 0 degrees apart, and the first external angle θ1 and the second external angle θ2 are maximum, roughly greater than 135 degrees. The distance D1 between the first rotating axis SX1 and the first axis X1 is greater than the distance L1 between the first pivot axis PX1 and the first axis X1, and the distance D2 between the second rotating axis SX2 and the second axis X2 is greater than the distance L2 between the second pivot axis PX2 and the second axis X2. That is, the first pivot axis PX1 is substantially between the first axis X1 and the first rotating axis SX1, and the second pivot axis PX2 is substantially between the second axis X2 and the second rotating axis SX2. The pivot module 8, the torque module 9, the first transmission member 3 and the second transmission member 6 are separated from the first accommodating groove 23 and the second accommodating groove 53 respectively, and the first transmission member 3 and the second transmission member 6 abut against the first limiting member 22 and the second limiting member 52 respectively. The bendable area A1 of the flexible screen A bends (the cross-section is U-shaped), the first wing member 21 and the second wing member 51 are further away from the central base 1, so that the flexible screen A can be lifted upward, whereby the first wing member 21, the second wing member 51 and the central base 1 jointly define an accommodating space S to accommodate the bendable area A1.

In summary, in the foldable electronic device of the present disclosure, the first wing member and the second wing member can pivot relative to the central base and pivot relative to the first connecting rod and the second connecting rod, wherein the first connecting rod and the second connecting rod can pivot relative to the first transmission member and the second transmission member respectively, and the first transmission member and the second transmission member move together with the first rod and the second rod respectively so as to drive the first rod and the second rod to synchronously and reversely rotate, such that when the first panel body and the second panel body are in the unfolded state, the first wing member and the second wing member jointly support the bendable area of the flexible screen, and when the first panel body and the second panel body are in the folded state, the first wing member and the second wing member are further away from the central base, thereby the flexible screen can be lifted upward, whereby the first wing member, the second wing member and the central base can jointly and effectively s an accommodating space that is large enough to accommodate the bendable area.

What is claimed is:

1. A foldable electronic device, comprising:
a central base including a body portion, at least one first arc-shaped slider and at least one second arc-shaped slider, wherein the first arc-shaped slider and the second arc-shaped slider are respectively formed on the body portion and spaced apart from each other;
a pivot module disposed on the central base and including a first rod and a second rod, wherein the first rod and the second rod are pivotally connected to the body portion along a first axis and a second axis respectively and are able to synchronously and reversely rotate;
a torque module disposed on the pivot module;
a first panel body including a first wing member, wherein the first wing member has at least one first arc-shaped slideway and a first pivot joint, the first arc-shaped slider is slidably disposed on the first arc-shaped slideway, whereby the first wing member is able to pivot relative to the body portion with a first virtual axis as a center;
a first transmission member sleeved on the first rod and synchronously rotating with the first rod;
a first connecting rod pivotally connected to the first transmission member along a first pivot axis and pivotally connected to the first pivot joint along a first rotating axis;
a second panel body including a second wing member, wherein the second wing member has at least one second arc-shaped slideway and a second pivot joint, the second arc-shaped slider is slidably disposed on the second arc-shaped slideway, whereby the second wing member is able to pivot relative to the body portion with a second virtual axis as a center;
a second transmission member sleeved on the second rod, synchronously rotating with the second rod, and spaced apart from the first transmission member;
a second connecting rod pivotally connected to the second transmission member along a second pivot axis and pivotally connected to the second pivot joint along a second rotating axis; and
a flexible screen disposed on the first panel body and the second panel body and including a bendable area;
wherein the first panel body and the second panel body are able to transform between an unfolded state and a folded state, wherein when the first panel body and the second panel body are in the unfolded state, the flexible screen is flattened, and the first wing member and the second wing member jointly support the bendable area, and wherein when the first panel body and the second panel body are in the folded state, the bendable area of the flexible screen bends, and the first wing member, the second wing member and the central base jointly define an accommodating space for accommodating the bendable area;
wherein a first external angle is formed between the first connecting rod and the first wing member, and a second external angle is formed between the second connecting rod and the second wing member, wherein when the first panel body and the second panel body are in the unfolded state, the first external angle and the second external angle are minimum, wherein when the first panel body and the second panel body are transformed from the unfolded state to the folded state, the first external angle and the second external angle gradually become greater, and wherein when the first panel body and the second panel body are in the folded state, the first external angle and the second external angle are maximum.

2. The foldable electronic device of claim 1, wherein when the first panel body and the second panel body are in the unfolded state, a distance between the first rotating axis and the first axis is less than a distance between the first pivot axis and the first axis, and a distance between the second rotating axis and the second axis is less than a distance between the second pivot axis and the second axis, and wherein when the first panel body and the second panel body are in the folded state, the distance between the first rotating axis and the first axis is greater than the distance between the first pivot axis and the first axis, and the distance between the second rotating axis and the second axis is greater than the distance between the second pivot axis and the second axis.

3. The foldable electronic device of claim 2, wherein the first transmission member includes a first fixed joint, a first bending plate and a first shaft joint, which are integrally formed, wherein the first fixed joint is fixed to the first rod along the first axis, the first bending plate bends and extends outwardly from the first fixed joint along a radial direction of the first axis, and the first shaft joint extends outwardly from the first bending plate and is pivotally connected to the first connecting rod along the first pivot axis; wherein the second transmission member includes a second fixed joint, a second bending plate and a second shaft joint, which are integrally formed, and wherein the second fixed joint is fixed to the second rod along the second axis, the second bending plate bends and extends outwardly from the second fixed joint along a radial direction of the second axis, and the second shaft joint extends outwardly from the second bending plate and is pivotally connected to the second connecting rod along the second pivot axis.

4. The foldable electronic device of claim 3, wherein the torque module includes a plurality of friction fixed pieces and two pivot fixed pieces, which are passed through by the first rod and the second rod, and wherein one of the friction fixed pieces is disposed on one side of the first transmission member and one side of the second transmission member, the others of the friction fixed pieces are disposed between the pivot fixed pieces, and one of the pivot fixed pieces abuts against the first fixed joint and the second fixed joint.

5. The foldable electronic device of claim 4, wherein the pivot module further includes a first tooth portion, a second tooth portion and two gears, and wherein the first tooth portion is formed on one end of the first rod, the second tooth portion is formed on one end of the second rod, and the gears are meshed with each other and disposed between the first tooth portion and the second tooth portion and are meshed with the first tooth portion and the second tooth portion respectively, such that the first rod and the second rod are able to synchronously and reversely rotate.

6. The foldable electronic device of claim 5, wherein when the first panel body and the second panel body are in the unfolded state, both the first external angle and the second external angle are less than 45 degrees, and wherein when the first panel body and the second panel body are in the folded state, both the first external angle and the second external angle are greater than 135 degrees.

7. The foldable electronic device of claim 6, wherein each of the friction fixed pieces has a first penetrating hole and a second penetrating hole, and each of the pivot fixed pieces has a first shaft hole and a second shaft hole, and wherein the first rod passes through the first penetrating hole and the first shaft hole, and the second rod passes through the second penetrating hole and the second shaft hole.

8. The foldable electronic device of claim 7, wherein the torque module further includes a plurality of first stop washers, a plurality of first bowl-shaped washers, a plurality of second stop washers and a plurality of second bowl-shaped washers, wherein the first stop washers are sleeved on the first rod and located between the pivot fixed pieces, and move synchronously with the first rod, wherein the first bowl-shaped washers are sleeved on the first rod and constantly provide a first elastic force, and the first elastic force tends to make the first stop washers abut against the pivot fixed pieces and the friction fixed pieces, wherein the second stop washers are sleeved on the second rod and located between the pivot fixed pieces, and move synchronously with the second rod, and wherein the second bowl-shaped washers are sleeved on the second rod and constantly provide a second elastic force, and the second elastic force tends to make the second stop washers abut against the pivot fixed pieces and the friction fixed pieces.

9. The foldable electronic device of claim 8, wherein the pivot module further includes a first nut and a second nut, wherein the first nut is screwed to the other end of the first rod, and the second nut is screwed to the other end of the second rod, and wherein the first bowl-shaped washers are located between the first nut and the pivot fixed pieces, and the second bowl-shaped washers are located between the second nut and the pivot fixed pieces.

10. The foldable electronic device of claim 9, wherein when the first panel body and the second panel body are in the unfolded state, the first panel body and the second panel body are substantially 180 degrees apart, wherein when the first panel body and the second panel body are in the folded state, the first panel body and the second panel body are substantially 0 degrees apart, wherein when the first panel body and the second panel body are transformed between the unfolded state and the folded state, the first rod and the second rod synchronously and reversely rotate, so that the first stop washers, the second stop washers, the first fixed joint and the second fixed joint simultaneously generate friction with the pivot fixed pieces and the friction fixed pieces, thus to make that the first panel body and the second panel body are able to stop at any position and sandwich an angle between 0 degrees and 180 degrees.

11. The foldable electronic device of claim 1, wherein the first panel body further includes a first limiting member and a first accommodating groove, the first limiting member extends outwardly from the first wing member, and the first accommodating groove is surrounded and defined by the first wing member and the first limiting member, and wherein the second panel body further includes a second limiting member and a second accommodating groove, the second limiting member extends outwardly from the second wing member and is spaced apart from the first limiting member, and the second accommodating groove is surrounded and defined by the second wing member and the second limiting member.

12. The foldable electronic device of claim 11, wherein when the first panel body and the second panel body are in the unfolded state, the pivot module, the torque module, the first transmission member and the second transmission member are respectively and partially accommodated in the first accommodating groove and the second accommodating groove, and the first transmission member and the second transmission member are separated from the first limiting member and the second limiting member respectively, and wherein when the first panel body and the second panel body are in the folded state, the pivot module, the torque module, the first transmission member and the second transmission member are separated from the first accommodating groove and the second accommodating groove respectively, and the first transmission member and the second transmission member abut against the first limiting member and the second limiting member respectively.

13. The foldable electronic device of claim 12, wherein the first axis, the first virtual axis, the first pivot axis, the first rotating axis, the second axis, the second virtual axis, the second pivot axis and the second rotating axis are parallel to each other.

* * * * *